US 6,693,778 B1

(12) United States Patent
Pittman et al.

(10) Patent No.: US 6,693,778 B1
(45) Date of Patent: Feb. 17, 2004

(54) DIODE FAULT DETECTION AND GROUND FAULT DETECTION SYSTEMS

(75) Inventors: Wayne A. Pittman, Milpitas, CA (US); David P. Swartz, San Jose, CA (US)

(73) Assignee: Sensotec, Inc., Columbus, OH (US)

( * ) Notice: Subject to any disclaimer, the term of this patent is extended or adjusted under 35 U.S.C. 154(b) by 334 days.

(21) Appl. No.: 09/730,534

(22) Filed: Dec. 7, 2000

Related U.S. Application Data
(60) Provisional application No. 60/169,290, filed on Dec. 7, 1999.

(51) Int. Cl.[7] ................................................. H02H 3/00
(52) U.S. Cl. ............................... 361/42; 361/20; 361/23; 361/44
(58) Field of Search .............................. 361/42, 43, 115, 361/20, 44

(56) References Cited

U.S. PATENT DOCUMENTS

| | | | |
|---|---|---|---|
| 4,403,218 A | * 9/1983 | Beal et al. | 340/870.18 |
| 4,556,946 A | 12/1985 | Taniguti | 361/550 |
| 4,714,917 A | * 12/1987 | Counter et al. | 340/679 |
| 4,812,751 A | 3/1989 | Roberts et al. | 324/546 |
| 4,864,242 A | 9/1989 | Hurley | 324/510 |
| 5,508,620 A | 4/1996 | Pfiffner | 324/545 |
| 5,557,216 A | 9/1996 | Dailey et al. | 324/772 |
| 5,691,643 A | 11/1997 | Ishiguro et al. | 324/510 |

* cited by examiner

*Primary Examiner*—Stephen W. Jackson
(74) *Attorney, Agent, or Firm*—James Creighton Wray; Meera P. Narasimhan

(57) ABSTRACT

The new Ground Fault Detection and Diode Fault Detection (GFD/DFD) Systems have rotating and stationary component assemblies. The rotating assembly has four interface modules, which are normally encapsulated, in a specially configured support ring. The GFD/DFD Systems support ring assembly is bolted to the brushless exciter. The brushless exciter is attached to a generator or motor. The GFD/DFD System support ring is provided power by an induction loop antenna attached to a stationary Induction Power Supply (IPS). A Receiver Control Unit provides power to the IPS and receives and conditions the RF (radio frequencies) data transmitted from the GFD/DFD System support ring assembly. These units together provide the means to detect ground faults, to detect diode faults, and to activate alarm lights and electrical control signals for normal and faulty operating conditions.

38 Claims, 11 Drawing Sheets

GROUND FAULT DETECTION AND DIODE FAULT DETECTION SYSTEMS (1)

GROUND FAULT DETECTION AND DIODE FAULT DETECTION SYSTEMS (1)
FIGURE 1

ROTATING MODULES IN SUPPORT RING
FIGURE 2

TRANSMITTER/GROUND FAULT MODULE (6)

FIGURE 6

GROUND ISOLATION MODULE (9)

DIODE FAULT DETECTION AND GROUND FAULT DETECTION SYSTEMS

This application claims the benefit of U.S. Provisional Application No. 60/169,290, filed Dec. 7, 1999.

BACKGROUND OF THE INVENTION

Existing Ground Fault Detection (GFD) systems for brushless exciters rely on simple circuit designs generally operating by being powered directly from the circuit upon which they are trying to make measurements. Their simplicity makes them poor measurement devices, susceptible to variations in field voltages. Those units are also prone to false trips even when adjusted by the best technician using his best guess. Those GFD systems can only operate when power is supplied to the rotor windings and therefore cannot indicate an existing fault prior to start-up. Start-up during ground fault conditions may be disastrous.

Existing Diode Fault Detection (DFD) systems are also simple monitors generally relying upon the interpretation of a wave shape to guess a diode failure has happened somewhere in the system.

No known systems combine a ground fault detection system with a diode fault detection system. Diode and ground fault conditions have been a concern for years.

Ground fault and diode fault detection systems are needed to protect generators and motors from major breakdowns from ground faults, with attendant destruction of expensive equipment and loss of capacity during replacement or repair.

Needs exist for improved diode fault and ground fault protection systems.

SUMMARY OF THE INVENTION

The present invention is unique in its components, its non-contact measurement, its ground fault system independence from the field voltages, its ability to identify the location of the ground fault, its electronic diode fault system, and its ability to monitor both functions.

The GFD System is unique in its construction and operation. An induced power supply allows operation before start up and without power being supplied to the rotor windings. It also uses a non-contact data transmission for electrical isolation. The GFD System operation is independent from the field voltages, and provides a method to measure and inform the user of insulation resistance condition and the fault location regardless of motor or generator operational conditions.

The DFD System identifies the specific failed diode or diodes that has triggered an alarm, for ease of replacement.

The present invention provides systems that detect ground faults and detect diode faults. More particularly, the present invention provides systems that detect ground faults and detect diode faults in large generators and motors.

The present invention is a telemetry system for detecting diode faults and detecting ground faults in generators or motors. An objective of the invention is to provide a complete system, using unique low power transmitters, ground fault interface modules, diode fault interface modules to detect either ground faults, diode faults or both. Additionally the system provides reliable alarm signals of lights and/or electrical control signals.

The new Ground Fault Detection and Diode Fault Detection (GFD/DFD) Systems have rotating and stationary component assemblies. The rotating assembly has four interface modules, which are normally encapsulated, in a specially configured support ring. The GFD/DFD Systems support ring assembly is bolted to the brushless exciter. The brushless exciter is attached to a generator or motor. The GFD/DFD System support ring is provided power by an induction loop antenna attached to a stationary Induction Power Supply (IPS). A Receiver Control Unit provides power to the IPS and receives and conditions the RF (radio frequencies) data transmitted from the GFD/DFD System support ring assembly.

These units together provide the means to detect ground faults, to detect diode faults, and to activate alarm lights and electrical control signals for normal and faulty operating conditions.

These and further and other objects and features of the invention are apparent in the disclosure, which includes the above and ongoing written specification, with the claims and the drawings.

DETAILED DESCRIPTION OF THE PREFERRED EMBODIMENTS

The present invention is a telemetry system for detecting insulation ground faults and detecting diode faults (shorts or opens) in generators or motors 20, which include exciter coils 11, exciter diodes 10 and armature windings 12. The complete Ground Fault Detection and Diode Fault Detection (GFD/DFD) Systems 1 uniquely supplies low power to Transmitter/Ground Fault Module 6, Diode Interface Modules 7 and 8 and software in the Receiver Control Unit 2, to detect either ground faults, diode faults or both.

The Ground Fault Detection and Diode Fault Detection (GFD/DFD) Systems have rotating 15 and stationary 17 component assemblies. The rotating assembly 15 has four modules, which are normally encapsulated in a specially configured support ring. The GFD/DFD Systems support ring assembly is bolted to the existing brushless exciter, providing electrical connections for six sets of diode pairs 10. The brushless exciter is-attached to a generator or motor. The GDF/DFD System rotating modules 6, 7, 8 and 9 are provided power by Stationary and Rotating (induction) Loop Antennas 4 and 5 from the stationary Induction Power Supply (IPS) 3. The Receiver Control Unit (RCU) 2 provides power to the IPS 3 and receives and conditions the RF (radio frequency) signals from the rotating modules 6, 7, 8.

These units together provide the means to detect ground faults, detect diode faults, activate alarm lights and activate electrical control signals for normal and faulty conditions.

Figure 2:
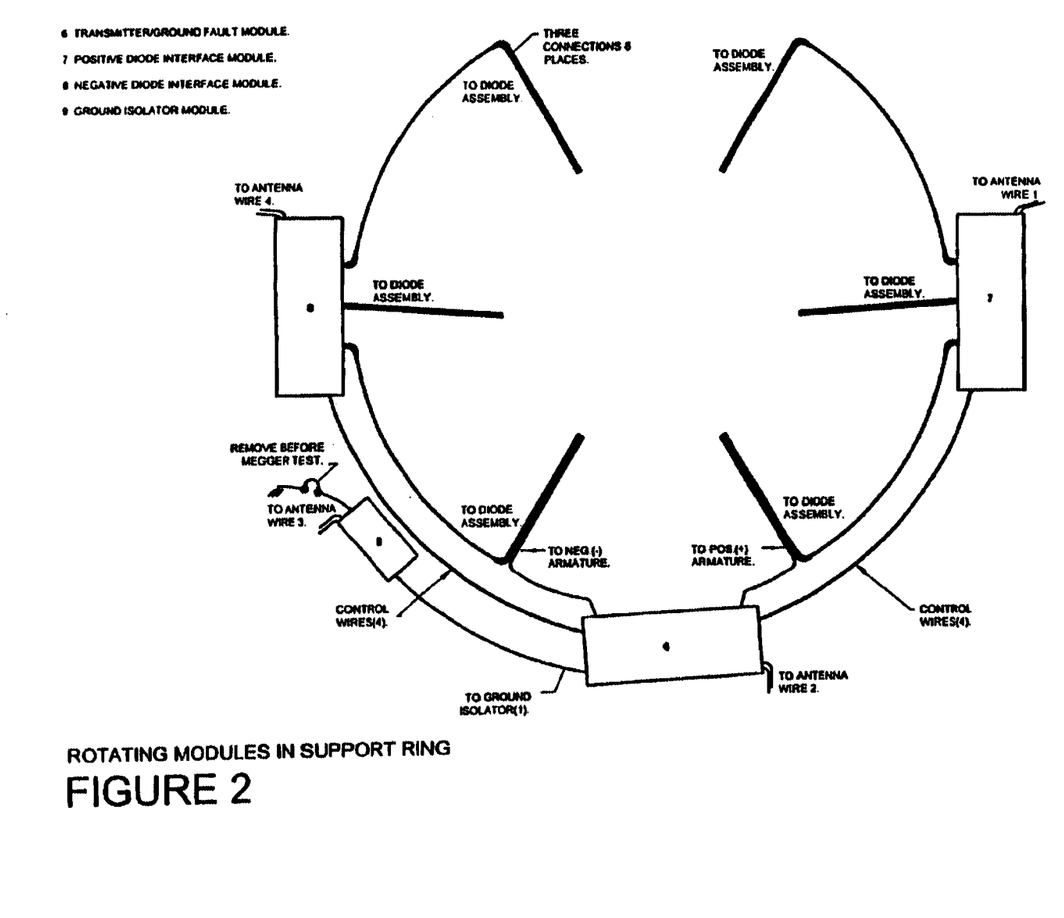
FIG. 2 shows the general relationship between the rotating modules, the Transmitter/Ground Fault Module, the Positive Diode Fault Module, the Negative Diode Fault Module and the Ground Isolator Module, which are assembled in a custom designed support ring.

As shown in FIG. 2, the GFD/DFD System's rotating modules 6, 7, 8, and 9 are powered by the Receiver Control Unit 2 via Rotating Loop Antenna 5 typically embedded in a groove in the outer diameter of the module support ring 19. The GFD/DFD System's rotating assembly has two Diode Interface Modules 7 and 8, one Transmitter/Ground Fault Module 6 and one Ground Isolation Module 9.

Figure 3:
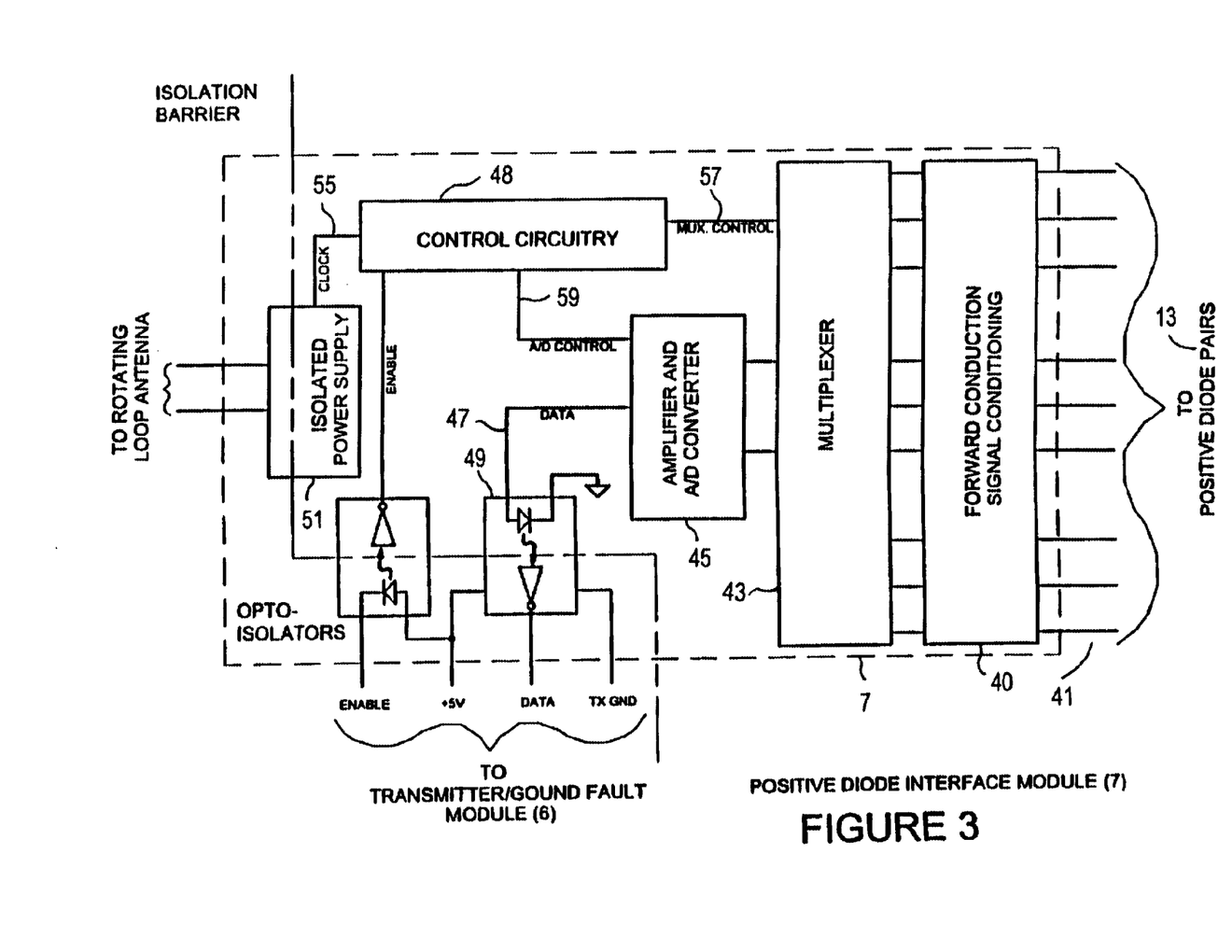
FIG. 3 is a detailed block diagram of the Positive Diode Interface Module.
Figure 4:
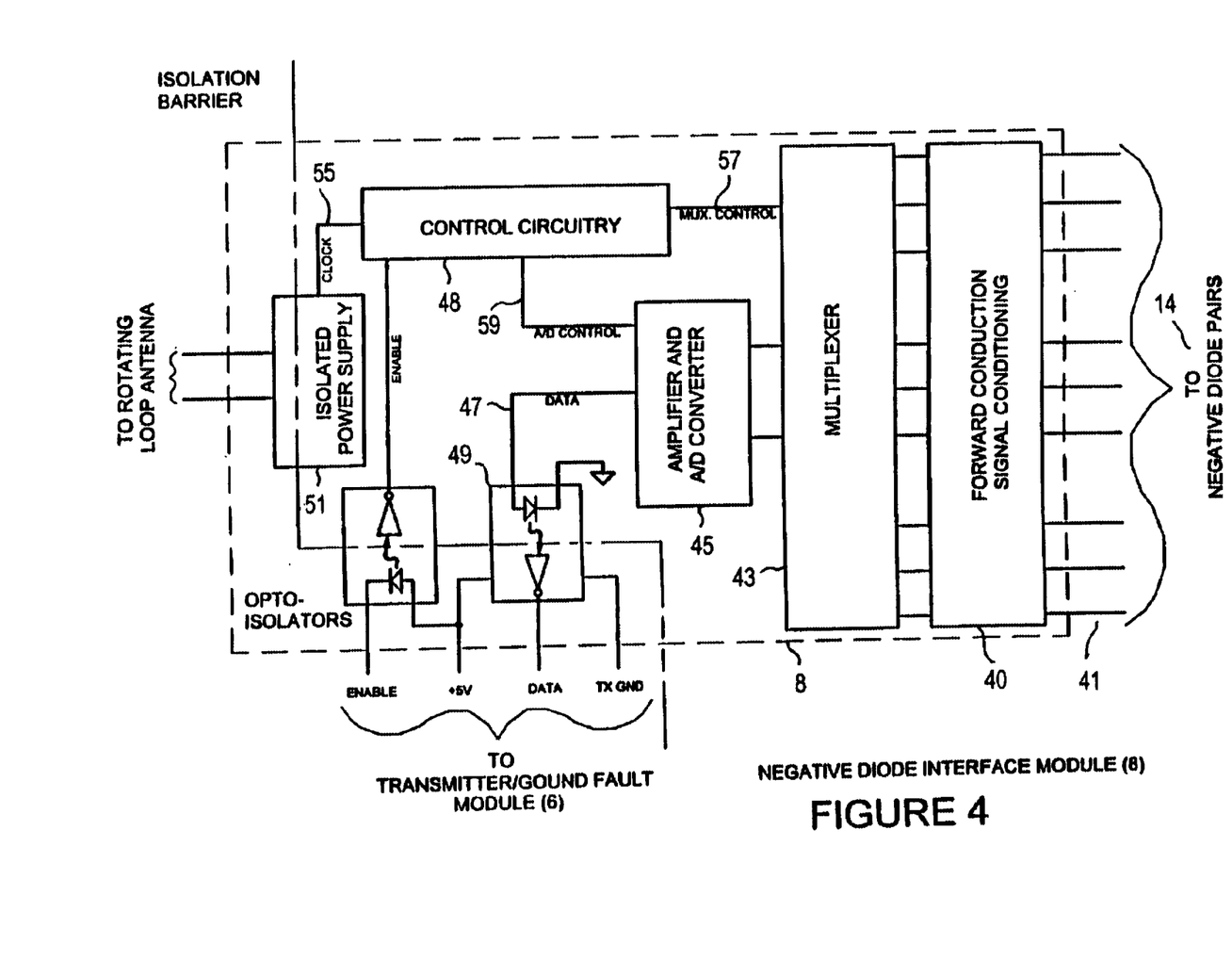
FIG. 4 is a detailed block diagram of the Negative Diode Interface Module.

As shown in FIG. 2, 3 and 4, the Diode Interface Modules 7 and 8 are connected to the diode pairs 10. The Positive Diode Interface Module 7 is connected to the positive diode pairs 13, the Negative Diode Interface Module 8 is connected to the negative diode pairs 14.

The Transmitter/Ground Fault Module 6 measures the insulation resistance between the generator windings 12 and the metal 16 of the generator structure.

Figure 1:
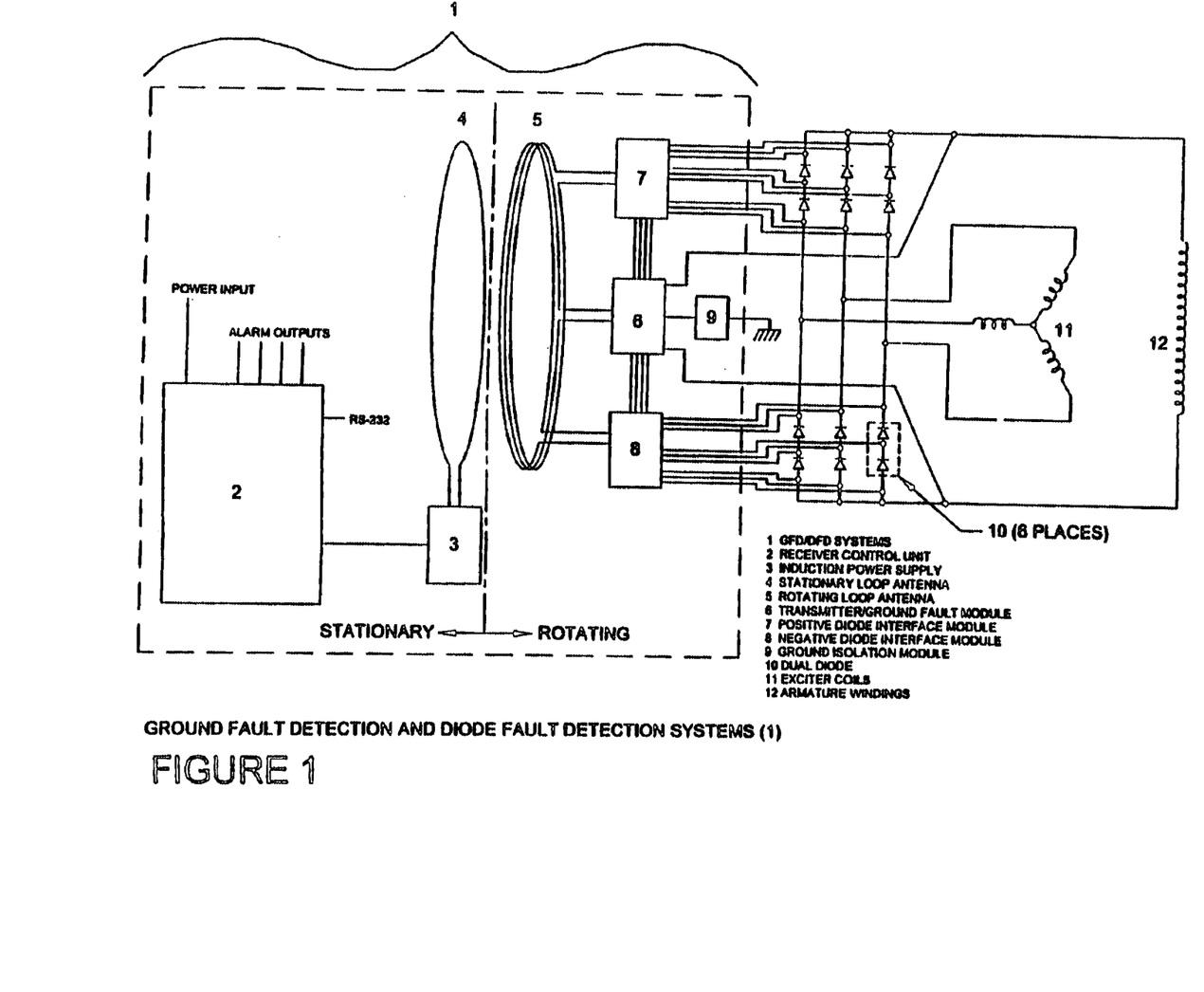
FIG. 1 is a block diagram of the overall GFD/DFD System.
Figure 6:
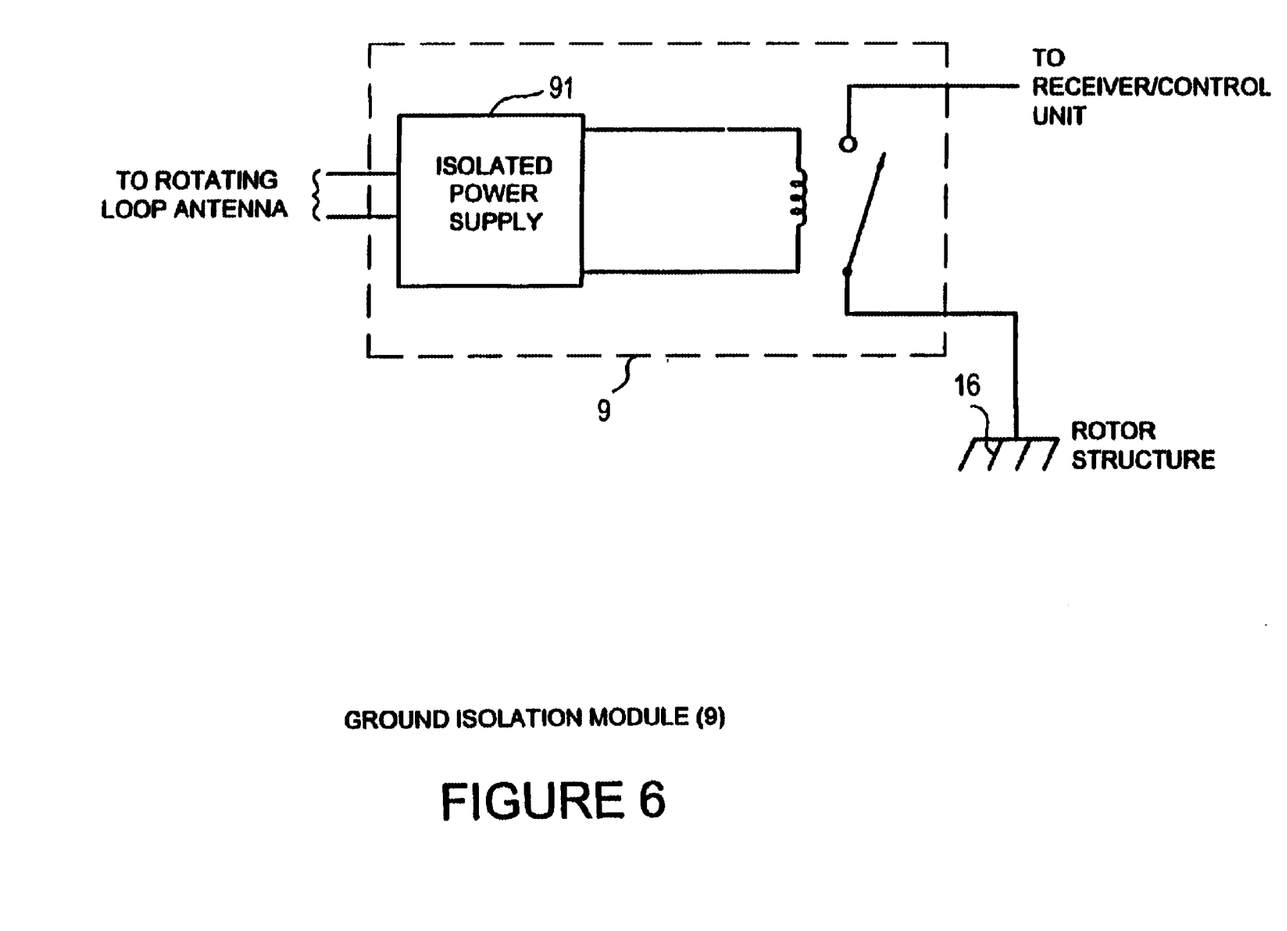
FIG. 6 is a detailed block diagram of the Ground Isolation Module.

The Ground Isolation Module 9, shown in FIGS. 1, 2 and 6, automatically opens the ground connection whenever power is removed from the GFD/DFD Systems. Opening of the ground to the generator structure connection facilitates operator insulation resistance testing by protecting the electronics from excessive test voltage.

Figure 5:
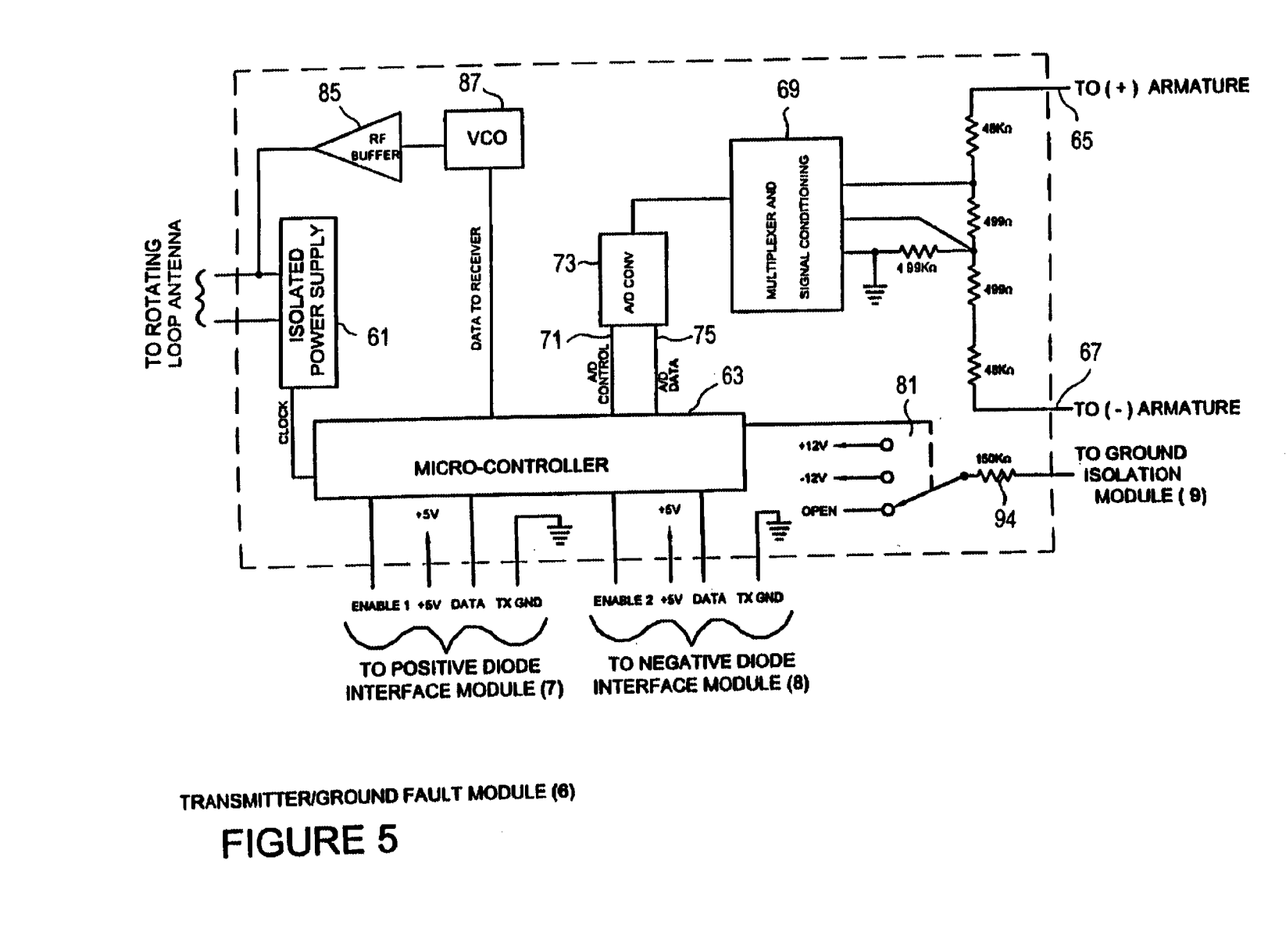
FIG. 5 is a detailed block diagram of the Transmitter/Ground Fault Module.

The Transmitter/Ground Fault Module 6, shown in FIGS. 1 and 5, controls the Positive and Negative Diode Interface Modules 7 and 8; it conditions the diode and insulation resistance data and transmits the data stream via RF through the loop antennas 5 and 4 to the Receiver Control Unit (RCU) 2 through the IPS 3.

Figure 7:
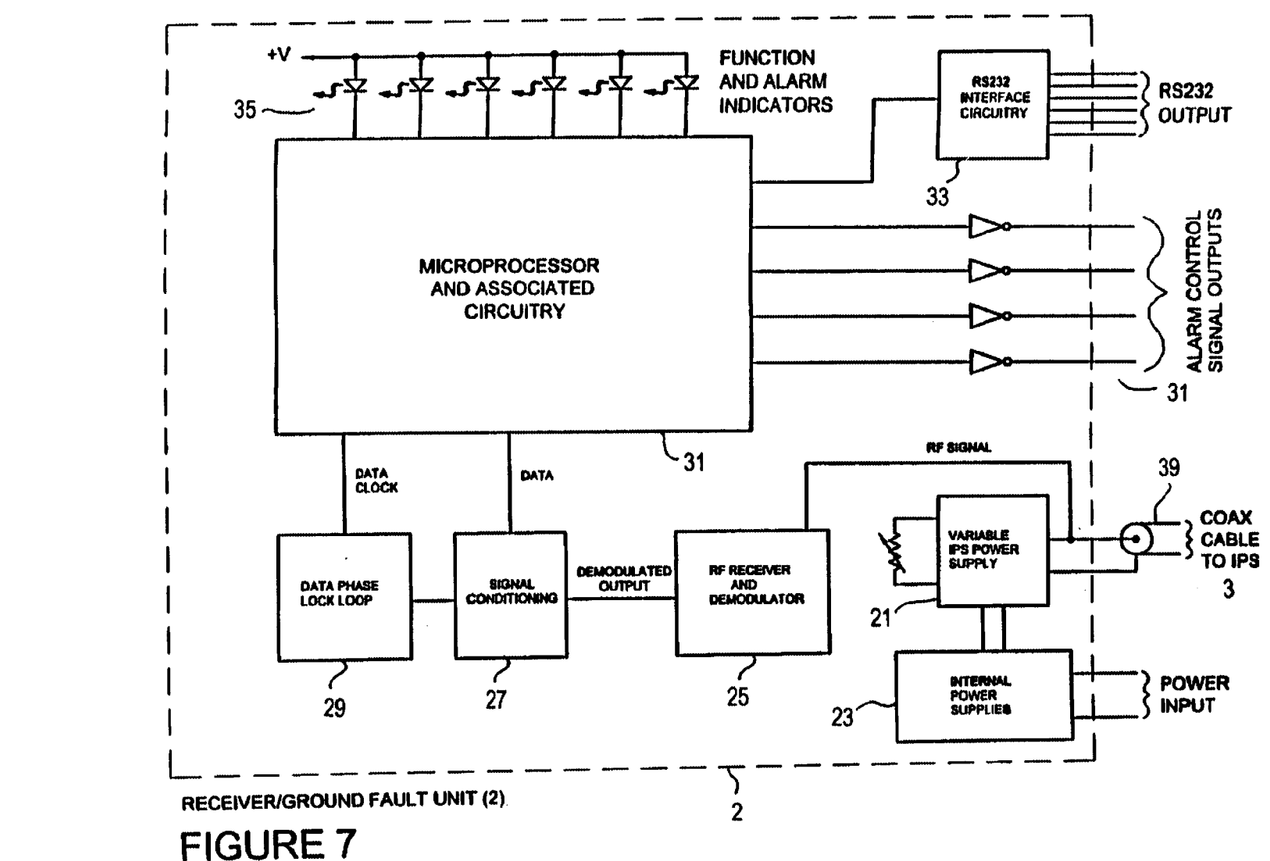
FIG. 7 is a detailed block diagram of the Receiver Control Unit.
Figure 8:
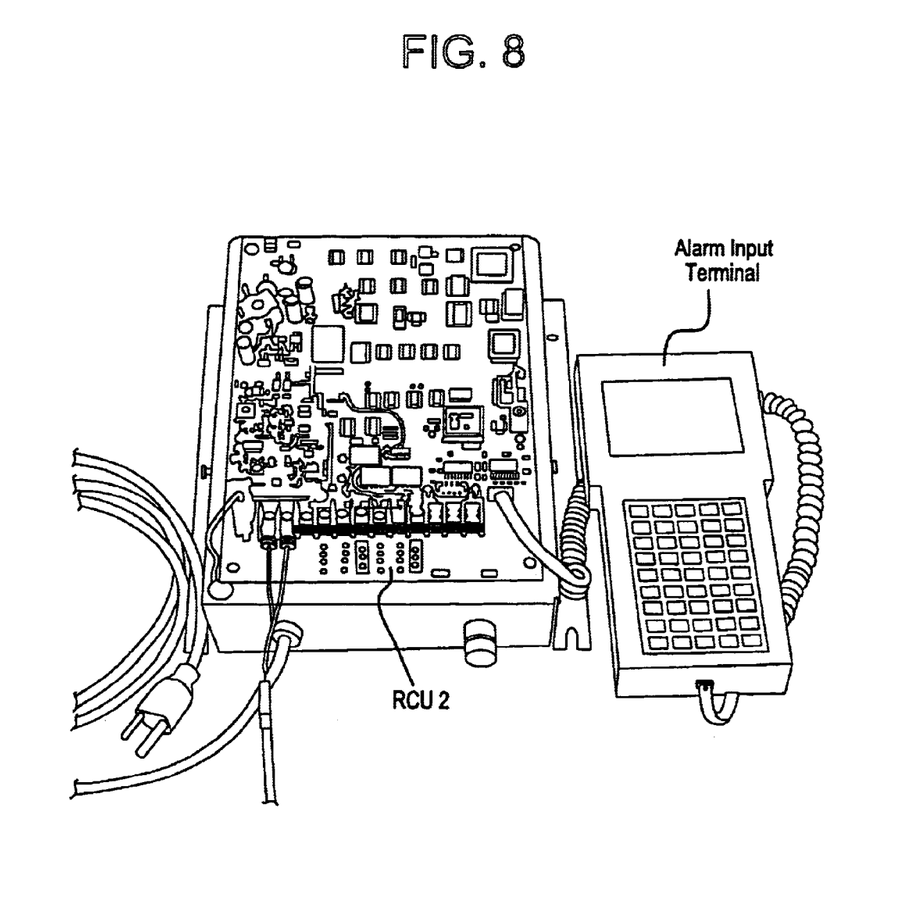
FIG. 8 is a photo the Receiver Control Unit.
Figure 9:
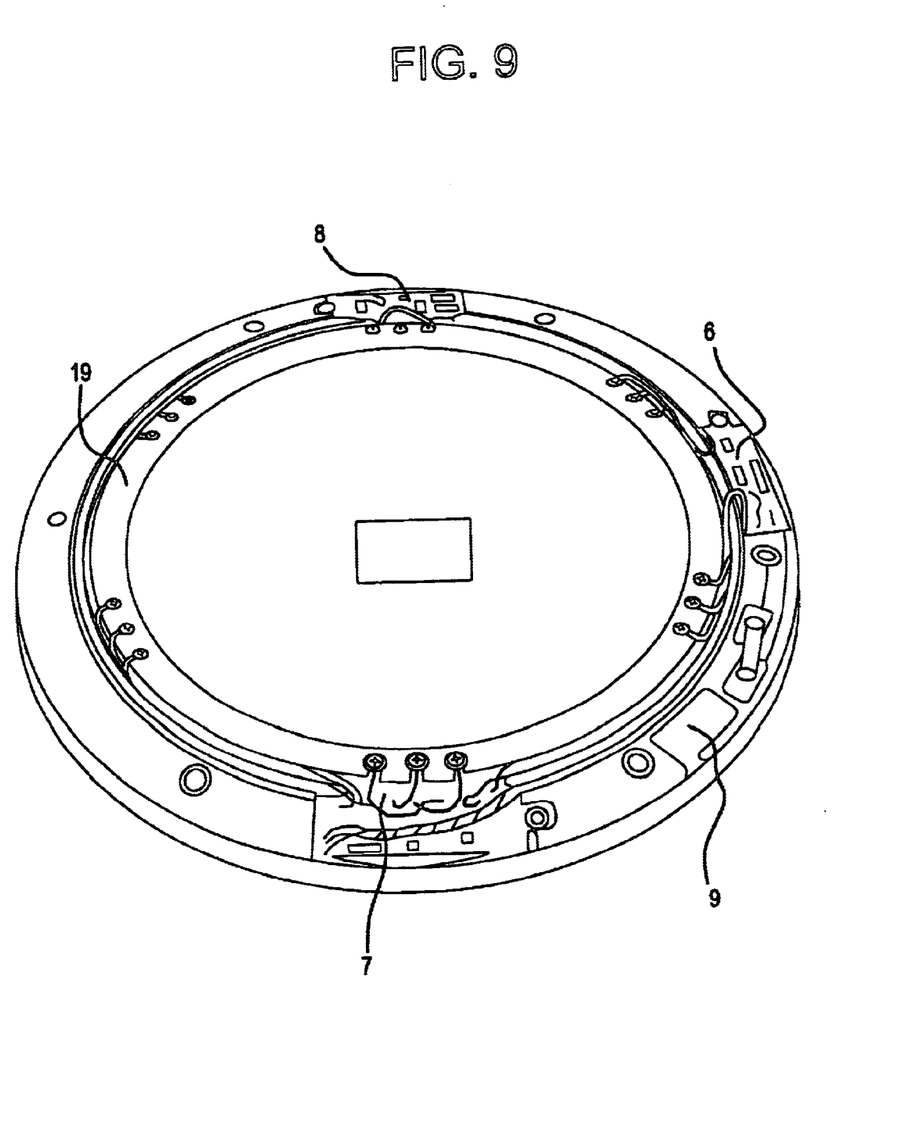
FIG. 9 is a photo of a Typical Module Support Ring Assembly

As shown in FIGS. 7 and 8, the Receiver Control Unit (RCU) 2 contains a variable DC power supply 21 for the IPS 3, multiple power supplies 23 for onboard use, an RF receiver and demodulator section 25, a signal conditioning section 27, a phase lock loop 29 to reconstruct the clock for synchronizing data, a microprocessor 31 for data manipulation and control, a RS-232 interface 33, six LED alarm light indicators 35 and four alarm control signal outputs 37. The RCU 2 is the source for all system power requirements.

As shown in FIG. 1, The Induction Power Supply (IPS) 3, driven by the variable DC supply in the RCU 2 through a coaxial cable 39, provides the power to the GDF/DFD Systems rotating modules 6, 7, 8, and 9 via induction loop antennas 4 and 5. The Stationary Loop Antenna 4 acts as the primary of an air core transformer with the Rotating Loop Antenna 5 acting as the secondary. The system does not need to be rotating to operate.

The system does not require any power from the brushless exciter to operate; the system is fully functional from its own separate power source.

The GFD/DFD System's isolation is maintained by multiple means, shown in FIGS. 3–5, such as separate isolated power supplies 51, 61 and 91, isolation transformers, opto-isolators, high resistance to the measurement circuits and blocking diodes. Primary system isolation is achieved by non-contact RF (radio frequencies) data transmission.

The DFD System measures the forward conduction drop across each of the diodes of the diode pairs 10. In the event one or more diodes short the voltages, measured in forward conduction drops, the DFD System compares the measured voltage to a programmable alarm limit and triggers an alarm that indicates a failed diode or diodes. The alarm is in the form of a light and/or a high/low electrical signal change.

As shown in FIGS. 3, 4, 11 and 12, the Diode Interface Modules 7 and 8 have internal signal conditioning 40 to limit the measured data from inputs 41 to only the forward conduction drop and reject the reverse signal. Each measurement is sequentially multiplexed 43 into an Analog to Digital (A/D) Converter 45. The output 47 of the A/D Converter is fed to the microcontroller on the Transmitter/Ground Fault Module 6 through opto-isolators 49. The opto-isolators are required to allow the Diode Interface Modules, 7 and 8, to electrically float at the potentials of the armature coil. On-board control circuitry 48 receives clock signals 55 from isolated power supply 51 and provides control signals 57, 59 to the multiplexer 43 and A/D converter 45.

Figure 10:
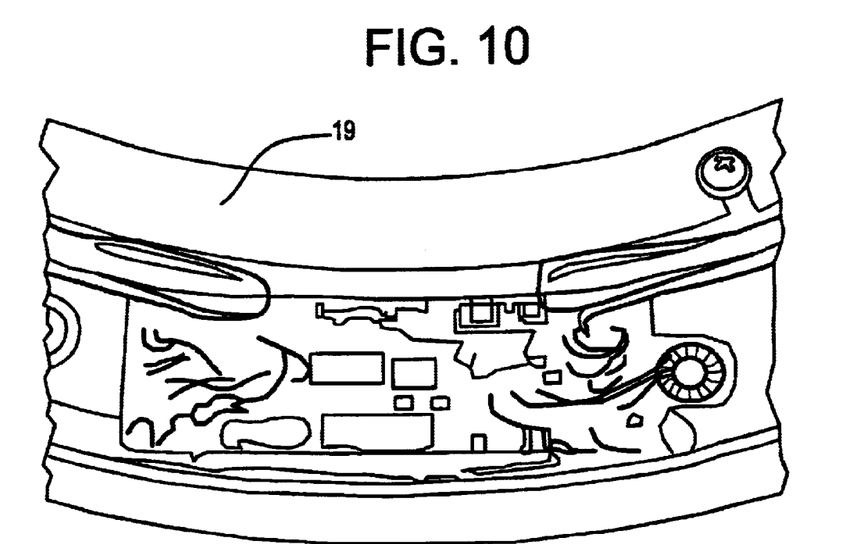
FIG. 10 is a photo of the Transmitter/Ground Fault Module shown being installed in support ring.
Figure 11:
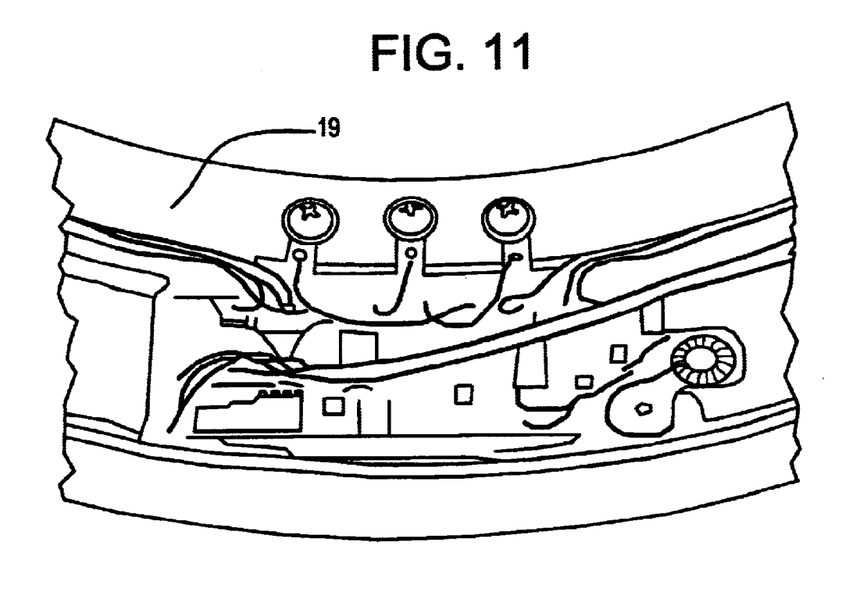
FIG. 11 is a photo of the Positive Diode Fault Module shown being installed in support ring.
Figure 12:
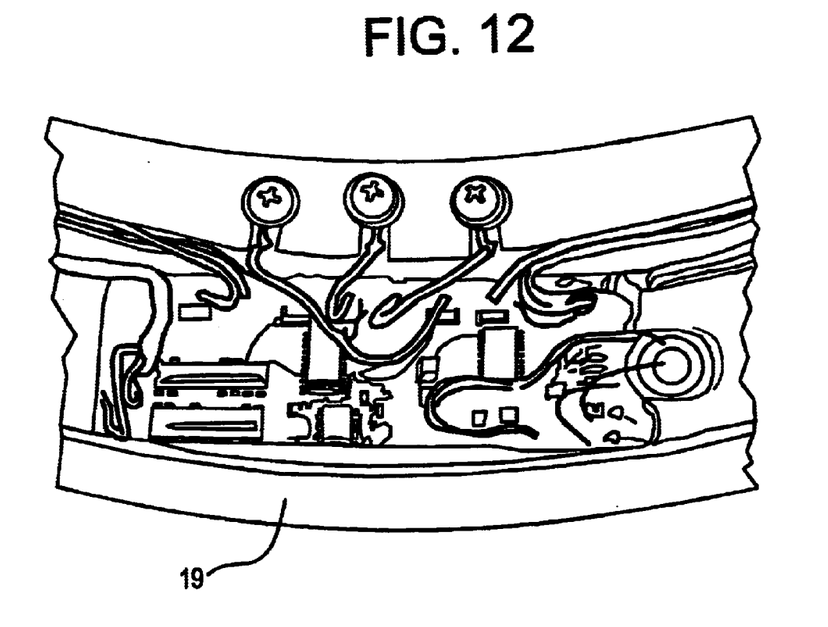
FIG. 12 is a photo of the Negative Diode Fault Module shown being installed in support ring.
Figure 13:
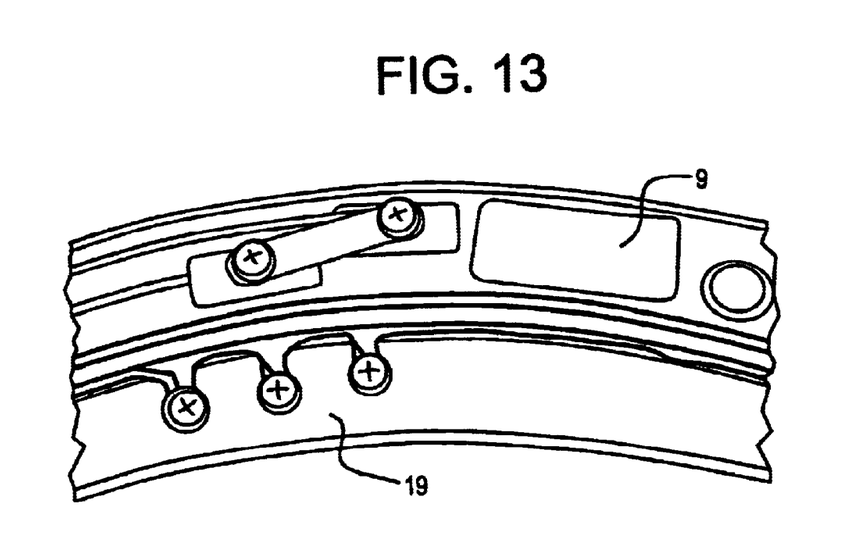
FIG. 13 is a photo of the Ground Isolation Module shown being installed in support ring.

As shown in FIGS. 2 and 10, the GFD System measures the insulation resistance between the field windings and the metal 16 rotor structure. The insulation resistance is compared to a programmable alarm limit in the RCU 2. If the GFD System is triggered by a low insulation value, the RCU 2 activates an indicator and a high/low electrical signal change.

The GFD System, as shown in FIGS. 2, 5, 9 and 10, makes the insulation resistance measurement by applying multiple voltages 81 across the field coil windings and the metal 16 of the rotor structure. The GFD System monitors the current flow by measuring voltage across resistor 94 as impressed by multiple voltages and computes the differences in current to correct for the variation in the field coil voltage impressed on the insulation. The ground fault module 6 has isolated power supply 61 that supplies power and clock signals to a microcontroller 63. Voltage level signals from the positive armature 65 and negative armature 67 are provided via a voltage divider to signal conditioning multiplexer 69. The microcontroller 63 provides control signals 71 to an A/D converter 73 and receives digital data 75.

Microcontroller 63 provides data to the receiver 2 through a VCO 87, an RF buffer 85 and the antenna loops 5 and 4. As shown in FIG. 6, the Ground Isolation Module (GIM) 9 has an isolated power supply 91 which when energized from the rotating power loop closes a switch between the rotor structure 16 and the transmitter/ground fault module 6, and to automatically disconnect the ground connection when power is removed.

By performing additional calculations on the multiple currents due to the insulation breakdown, the GFD System provides an approximation to where the insulation breakdown occurs relative to the field coil end.

While the invention has been described with reference to the specific embodiments, modification and variations of the invention may be constructed without departing from the scope of the invention, which is defined in the following claims.

We claim:

1. Ground fault detection and diode fault detection apparatus comprising a stationary section and a rotating section, the stationary section having a power input, a receiver/control unit connected to the power input, an induction power supply connected to the receiver control unit and a stationary loop antenna connected to the induction power supply, the rotating section having a rotating loop antenna, a transmitter/ground fault module connected to the rotating loop antenna, a ground isolation module connected to the transmitter/ground fault module for connecting a ground to the transmitter/ground fault module upon activation, diode interface modules connected to the rotating loop antenna for connection to diodes in the generator or motor.

2. The apparatus of claim 1, wherein the transmitter/ground fault module includes an isolated power supply connected to the rotating loop antenna, a microcontroller connected to the isolated power supply and connected to the diode interface modules for enabling the diode interface modules and receiving data from the diode interface modules.

3. The apparatus of claim 2, wherein the transmitter/ground fault module further comprises negative and positive connections for connecting to armature windings of a generator or motor, a voltage divider connected to the negative and positive connectors and a signal conditioning multiplexer connected to the voltage divider, and analog to digital converter connected to the signal conditioning multiplexer and connected to the microcontroller for supplying data signals to the microcontroller.

4. The apparatus of claim 3, further comprising a switch connected to the microcontroller for alternatively connecting the ground isolation module to voltage supplies and to an open circuit.

5. The apparatus of claim 4, wherein the switch alternatively connects the ground isolation module to a negative low voltage or a positive low voltage or to the open condition.

6. The apparatus of claim 3, further comprising a transmitter connected to the microcontroller and an RF buffer connected to the transmitter for providing data signals to the transmitter and radio frequency signals from the transmitter through the RF buffer, and wherein the RF buffer is connected to the rotating loop antenna for transferring RF signals through the rotating loop antenna to the stationary loop antenna and to the receiver control unit in the stationary section.

7. The apparatus of claim 1, wherein the diode interface modules comprise forward conduction signal conditioning circuits connected to diode pairs in a motor or generator exciter, multiplexers connected to the forward conditioning circuit, amplifiers and analog to digital converters connected to the multiplexers and data opto-isolators connected to the amplifiers and converter for supplying data signals to the transmitter/ground fault module microcontroller.

8. The apparatus of claim 7, wherein the diode interface modules further comprise isolated power supplies connected to the loop rotating loop antenna and controls connected to the isolated power supply and to the converter and to the multiplexer for controlling the multiplexer and converter, and enabling opto-isolators connected to the controls and to the microprocessor in the transmitter/ground fault module for providing enable signals to the controls.

9. The apparatus of claim 1, wherein the ground isolation module further comprises an isolated power supply connected to the rotating loop antenna and a switch connected to the isolated power supply for closing upon power being supplied through the isolated power supply, the switch being connected between the transmitter/ground fault module and ground metal in a rotor structure of the generator or motor.

10. The apparatus of claim 1, wherein the receiver/control unit further comprises, a power input, an internal power supply connected to the power unit, a variable induction power supply connected to the internal power supply, a coaxial cable connected to the variable induction power supply for connecting to the induction power supply, a radio frequency (RF) receiver and demodulator connected to the coaxial cable for receiving RF signals from the coaxial cable, a signal conditioning unit connected to the RF receiver and demodulator for conditioning demodulated output signals, a microprocessor connected to the signal conditioning unit for receiving data from the signal conditioning unit, a data phase lock loop connected to the signal conditioning unit and to the microprocessor for extracting a data clock signal from the demodulated and conditioned signals and providing the data clock signal to the microprocessor, multiple function and alarm indicators connected to the microprocessor for selectively indicating alarm conditions, alarm signal outputs connected to the microprocessor for providing alarm control signal outputs to remote units, a computer communications interface circuit, i.e., RS232, connected to the microprocessor for providing communications.

11. A fault detector apparatus comprising:
   a control module,
   a power supply in the module,
   a variable induction power controller connected to the power supply,
   a coaxial cable connected to the module,
   a radio frequency receiver and demodulator connected to the coaxial cable,
   a signal conditioner connected to the receiver and demodulator,
   a phase lock loop connected to the conditioner,
   a microprocessor connected to the signal conditioner and to the phase lock loop, and
   visible function and alarm indicators, remote alarm control outputs and an interface connector connected to the microprocessor.

12. The fault detector apparatus of claim 11, further comprising an induction power supply connected to the controller and a stationary antenna connected to the induction power supply and to the coaxial cable.

13. The fault detector apparatus of claim 12, further comprising the coaxial cable being connected between the controller and the induction power supply.

14. The fault detector apparatus of claim 12, further comprising:
   a rotating mount on a generator or motor,
   a rotating antenna on the mount,
   a transmitter/fault module having an isolated power supply connected to the rotating antenna,
   a microcontroller connected to the isolated power supply,
   an RF oscillator connected to the microcontroller and connected to the rotating antenna, and
   fault detectors connected to the microcontroller.

15. The fault detector apparatus of claim 14, further comprising:
   connectors for connecting to armature windings of a generator or motor,
   a voltage divider connected to the connectors,
   a signal conditioner and multiplexer connected to the voltage divider and an analog to digital converter connected between the microcontroller, and the conditioner and multiplexer.

16. The fault detector apparatus of claim 15, further comprising a switch connected to the microcontroller and a generator or motor metal connection connected to the switch.

17. The fault detector apparatus of claim 15, further comprising a low positive voltage, a low negative voltage and open connections connected to the switch for selectively connecting one of the connections to the generator or motor metal connection.

18. The fault detector apparatus of claim 17, further comprising a ground isolation module on the mount, an isolated power supply connected to the rotating antenna, a second switch associated with the isolated power supply and connected to the generator or motor metal connection for closing the second switch upon powering of the isolated power supply.

19. The fault detector apparatus of claim 14, further comprising positive and negative diode fault detectors on the mount, each having a forward conduction signal conditioner with multiple connectors for connecting to exciter diodes of a generator or motor, a multiplexer connected to the conditioner and an analog to digital convertor connected to the multiplexer and a data isolator connected between the converter and the microcontroller.

20. The fault detector apparatus of claim 19, each diode fault detector further comprising an isolated power supply (IPS) connected to the rotating antenna, a controller connected to the IPS, an enabling isolator connected between the microcontroller and the controller and multiplexer and converter controls connected between the controller and the multiplexer and the converter.

21. The method of detecting ground faults and diode faults in a generator or motor comprising providing a stationary unit and a rotating unit, providing a power input to a receiver/control unit in the stationary unit, providing power from the receiver/control unit to an induction power supply, providing power from the induction power supply to a stationary loop antenna in the stationary unit, providing power from the stationary loop antenna to a rotating loop antenna in the rotating unit, providing power from the rotating loop antenna to a transmitter/ground fault module, to diode interface modules and to a ground isolation module, providing multiple connections from diode pairs in exciter circuits of the generator or motor to the interface modules, connecting the transmitter/ground fault module to armature windings in the generator or motor, receiving forward conduction signals from the diode pairs and conditioning the forward conduction signals from the diode pairs in the diode interface modules, multiplexing the conditioned forward conduction signals and amplifying and converting the forward conduction signals to digital signals, providing isolated power supplies in the diode interface modules and providing clock signals between the isolated power supplies and control circuitry, providing multiplexing control signals and converting control signals from the control circuitry, providing data signals from the converter to opto-isolators and providing the digital signals from the opto-isolators to a microcontroller in the transmitter/ground fault module, providing data signals from the microcontroller to a voltage controlled oscillator in the transmitter/ground fault module and providing and buffering radio frequency signals from the oscillator, conducting the radio frequency signals to the rotating antenna loop, transmitting the radio frequency signals to the stationary loop antenna and conducting the radio frequency signals to the receiver/control unit as incoming signals, demodulating and conditioning the incoming signals and providing data from the demodulated and conditioned incoming signals to a microprocessor, extracting data clock signals from the demodulated and conditioned signals and providing the data clock signals to the microprocessor, controlling function and alarm indicator lights with the microprocessor, providing alarm control signal outputs from the microprocessor to remote terminals and providing computer communication interface circuit on the microprocessor for connecting a remote computer to the microprocessor.

22. The method of claim 21, further comprising selectively connecting a positive or negative low power source to a generator or motor metal connection, connecting armature windings to a voltage divider, providing signals from the voltage divider through conditioner multiplexer to a converter and providing digital signals from the converter to the microcontroller.

23. The method of detecting faults in a generator or motor comprising providing a stationary unit and a rotating unit, providing a power input to a receiver/control unit in the stationary unit, providing power from the receiver/control unit to an induction power supply, providing power from the induction power supply to a stationary loop antenna in the stationary unit, providing power from the stationary loop antenna to a rotating loop antenna in the rotating unit, providing power from the rotating loop antenna to an isolated power source transmitter/fault module, providing a microcontroller in the transmitter/fault. module, creating digital signals in response to faults, providing the digital signals to the microcontroller, providing data signals from the microcontroller to a voltage controlled oscillator in the transmitter/ground fault module and providing and buffering radio frequency signals from the oscillator, conducting the radio frequency signals to the rotating loop antenna, transmitting the radio frequency signals to the stationary loop antenna and conducting the radio frequency signals to the receiver/control unit as incoming signals, demodulating and conditioning the incoming signals and providing data from the demodulated and conditioned incoming signals to a microprocessor, extracting data clock signals from the demodulated and conditioned signals and providing the data clock signals to the microprocessor, controlling function and alarm indicator lights with the microprocessor, providing alarm control signal outputs from the microprocessor to remote terminals and connecting computer communications interface circuit to the microprocessor for connecting a remote computer to the microprocessor.

24. The method of claim 23, wherein the creating digital signals comprises selectively connecting a positive or negative low power source to a generator or motor metal connection, connecting armature windings to a voltage divider, providing signals from the voltage divider through a conditioner multiplexer to a converter and providing digital signals from the converter to the microcontroller.

25. The method of claim 23, wherein the creating digital signals comprises providing multiple connections from diode pairs in exciter circuits of the generator or motor to diode interface modules, receiving forward conduction signals from the diode pairs and conditioning the forward conduction signals from the diode pairs in the diode interface modules, multiplexing the conditioned forward conduction signals and amplifying and converting the forward conduction signals to digital signals, providing isolated power supplies in the diode interface modules and providing clock signals between the isolated power supplies and control circuitry, providing multiplexing control signals and converting control signals from the control circuitry, providing digital signals from converting to opto-isolators and providing the digital signals from the opto-isolators to the microcontroller in the transmitter/fault module.

26. A ground fault detection system for a rotor comprising:

a stationary receiver and control unit, a power input connected to the receiver and control unit, a stationary loop connected to the receiver and control unit for providing induction power, a rotatable unit, a rotatable loop connected to the rotatable unit for receiving the induction power from the stationary loop, and an RF transmitter and a fault detector connected to the rotatable unit for detecting faults and transmitting wireless RF signals to the receiver and control unit.

27. The system of claim 26, wherein the rotor comprises the rotor of a generator or motor, and the fault detector comprises a ground fault detector for detecting ground faults between windings and metal of the rotor.

28. The system of claim 26, wherein the receiver and control unit controls ground fault detecting power output from the ground fault detector.

29. The system of claim 26 wherein the detector further comprises diode fault detectors connected to diodes of the rotor for detecting diode faults using the induction power and for transmitting the diode faults via the transmitter to the receiver.

30. The system of claim 27 wherein the detector further comprises diode fault detectors connected to diodes of the rotor for detecting diode faults with the induction power and for transmitting the diode faults via the transmitter to the receiver.

31. The system of claim 26, wherein the transmitter and the fault detector further comprise a microcontroller for controlling application of the induction power to the fault detector and for transmitting wireless digital data to the receiver and control unit.

32. A method of detecting faults in a rotor of an electrical generator or motor comprising:

providing an inductive loop antenna, providing inductive power to a fault detector and transmitter on the rotor, detecting faults of the rotor using the inductive power, and transmitting wireless signals indicative of the faults from the transmitter to a receiver.

33. The method of claim 32, wherein the detecting faults further comprises detecting ground faults of the rotor.

34. The method of claim 33, wherein the detecting faults further comprises detecting diode faults of the rotor.

35. The method of claim 32, wherein the detecting faults further comprises detecting diode faults of the rotor.

36. The method of claim 35, further comprising controlling of application of the inductive power to the diode fault detector with a controller in the receiver.

37. The method of claim 32, further comprising controlling the detecting of faults by transmitting digital control signals from the receiver through the inductive loop to the fault detector.

38. The method of claim 37, further comprising providing a microcontroller and analog/digital converter in the transmitter and converting the digital control signals and applying voltages by the detector and wherein the detecting comprises detecting voltages and converting the detected voltages to digital signals, and wherein the transmitting comprises wireless transmitting of the digital signals to the receiver.

* * * * *